(12) United States Patent
Searby

(10) Patent No.: US 8,000,101 B2
(45) Date of Patent: Aug. 16, 2011

(54) SYSTEM AND METHOD FOR ATTACHING LIQUID COOLING APPARATUS TO A CHASSIS

(75) Inventor: Tom J Searby, Eaton, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 97 days.

(21) Appl. No.: 12/508,289

(22) Filed: Jul. 23, 2009

(65) Prior Publication Data

US 2011/0019364 A1      Jan. 27, 2011

(51) Int. Cl.
*H05K 7/20* (2006.01)
*G06F 1/20* (2006.01)

(52) U.S. Cl. ............... 361/696; 361/679.47; 361/679.48; 361/679.53; 361/679.54; 361/695; 361/698; 361/699; 361/701; 361/702; 361/704; 165/73; 165/76; 165/104.33; 165/185; 312/236

(58) Field of Classification Search ............. 361/679.47, 361/679.49, 679.53, 690, 694–696, 698–699, 361/701–702, 704; 165/72–75, 80.4–80.5, 165/104.33, 185; 312/236
See application file for complete search history.

(56) References Cited

U.S. PATENT DOCUMENTS

| | | | |
|---|---|---|---|
| 6,039,111 A | 3/2000 | Kawaguchi | |
| 6,437,982 B1 | 8/2002 | Cardenas | |
| 6,747,869 B2 | 6/2004 | Dong | |
| 6,778,394 B2 * | 8/2004 | Oikawa et al. | 361/700 |
| 6,970,351 B2 * | 11/2005 | Perez et al. | 361/679.57 |
| 7,021,367 B2 | 4/2006 | Oikawa | |
| 7,295,436 B2 | 11/2007 | Cheon | |
| 7,447,017 B2 | 11/2008 | Koo | |
| 7,646,603 B2 * | 1/2010 | Bard et al. | 361/696 |
| 2004/0008483 A1 | 1/2004 | Cheon | |
| 2006/0087811 A1 * | 4/2006 | He | 361/687 |
| 2006/0090883 A1 | 5/2006 | Huang et al. | |

* cited by examiner

*Primary Examiner* — Robert J Hoffberg
(74) *Attorney, Agent, or Firm* — Kevin Hart

(57) ABSTRACT

A system for attaching liquid cooling apparatus includes a fan, a chassis and a grill. The chassis is configured to house electronic components in an interior volume and has an air flow opening large enough to receive the fan. The grill is configured to be fastened to the fan and to the chassis such that, when the grill is so fastened, the fan is disposed at least partially in the interior volume and the grill substantially covers the air flow opening. At least one recess is formed either in the chassis or the grill such that a coolant conduit may be inserted into the recess when the grill is not fastened to the chassis and the coolant conduit is confined within the recess when the grill is fastened to the chassis.

20 Claims, 11 Drawing Sheets

SYSTEM AND METHOD FOR ATTACHING LIQUID COOLING APPARATUS TO A CHASSIS

BACKGROUND

Many prior art systems have been designed that employ forced air for removing heat generated by electronic components such as those found within a computer. The heat generated by such components has increased dramatically in recent years as electronics technology has advanced. Consequently, newer systems have been designed that employ liquid cooling for this purpose.

DETAILED DESCRIPTION OF THE PREFERRED EMBODIMENTS

The inventors hereof have observed that prior art techniques for installing liquid cooling systems into electronic equipment chassis normally require that the cooling system be at least partially disassembled in the process. Once the cooling system components have been placed within the chassis, the cooling system must then be charged with coolant. Thus, prior art techniques present a risk of damaging electronic components inside the chassis with leaked liquid coolant.

The inventors have further observed that some but not all electronic systems require liquid cooling for adequate thermal management. Thus, they have recognized that it would be desirable to provide one solution that can be easily deployed either with or without liquid cooling.

Figure 1:
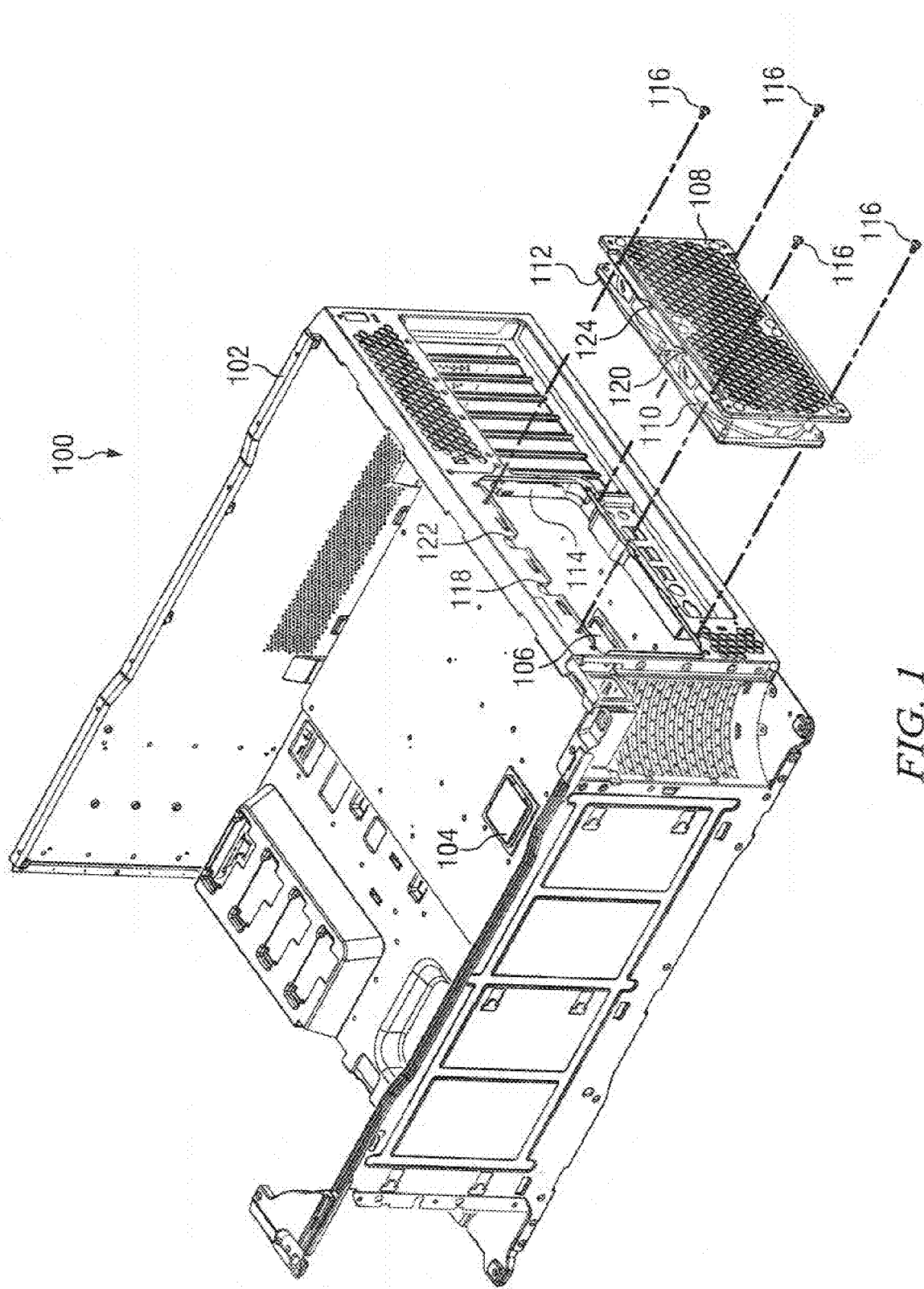
FIG. 1 is an exploded view illustrating an electronic equipment chassis and fan assembly according to a preferred embodiment of the invention.
Figure 2:
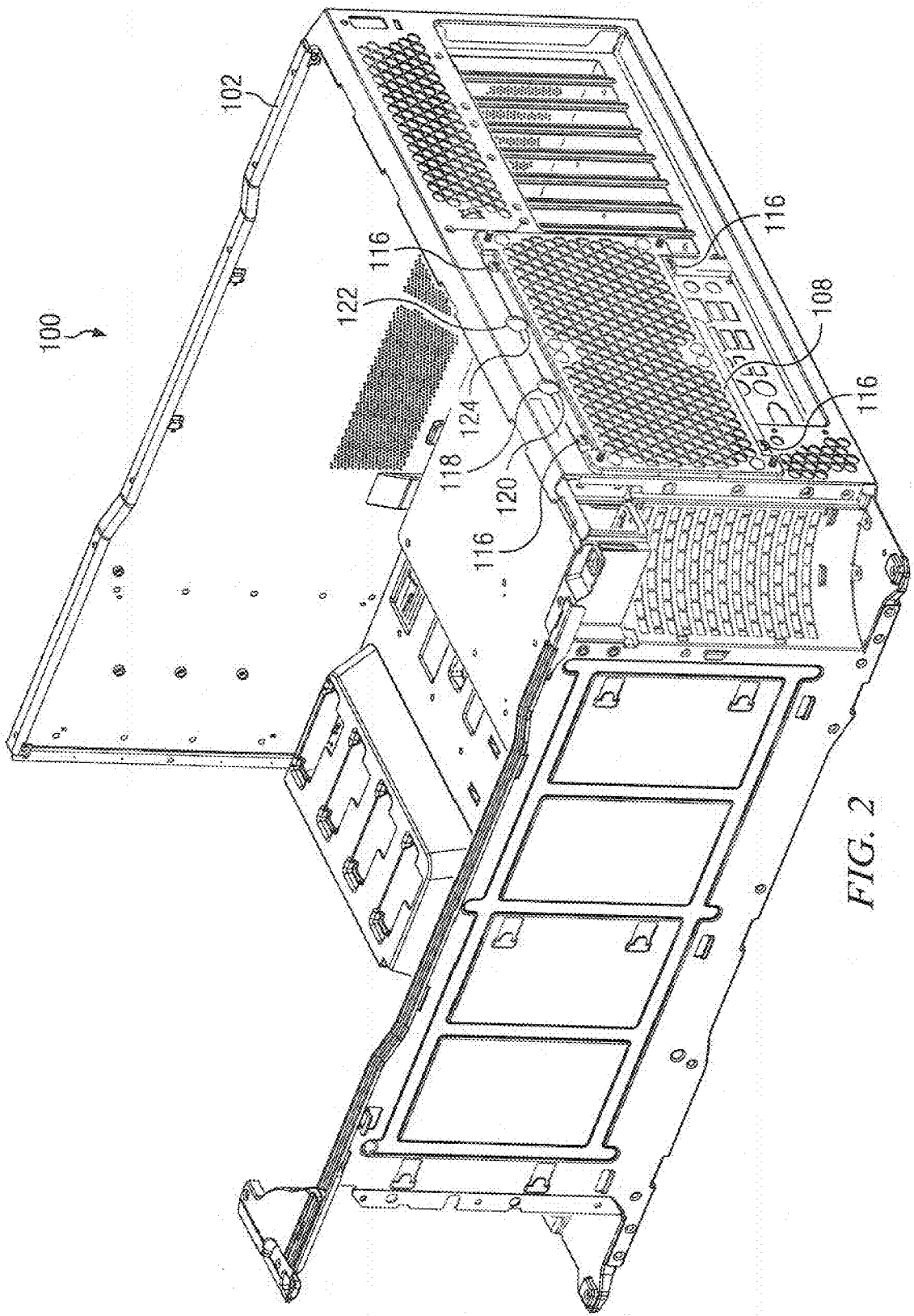
FIGS. 2 and 3 are assembled external and internal views, respectively, showing the fan assembly of FIG. 1 mounted to the chassis according to a preferred embodiment of the invention.
Figure 3:
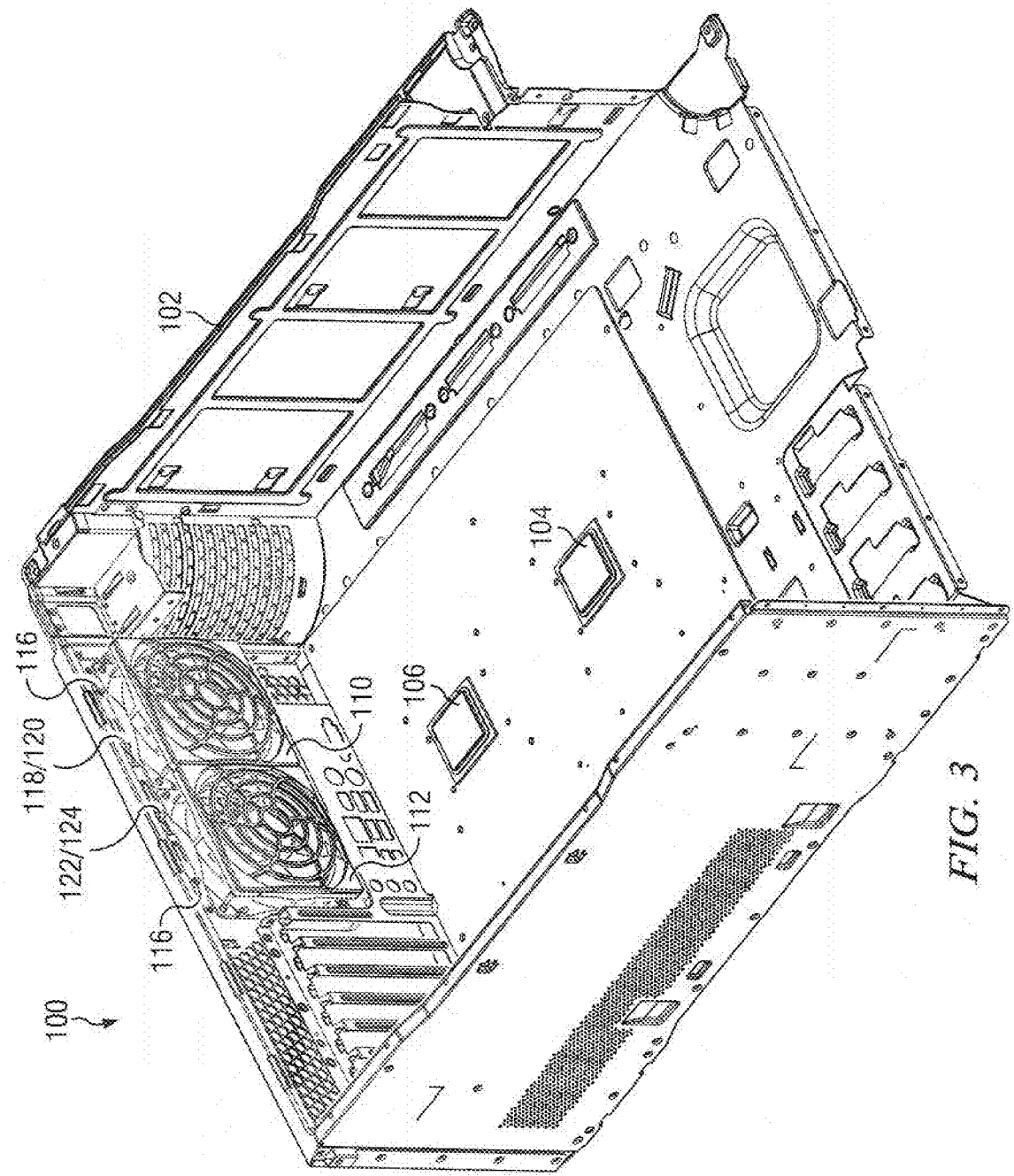
Figure 4:
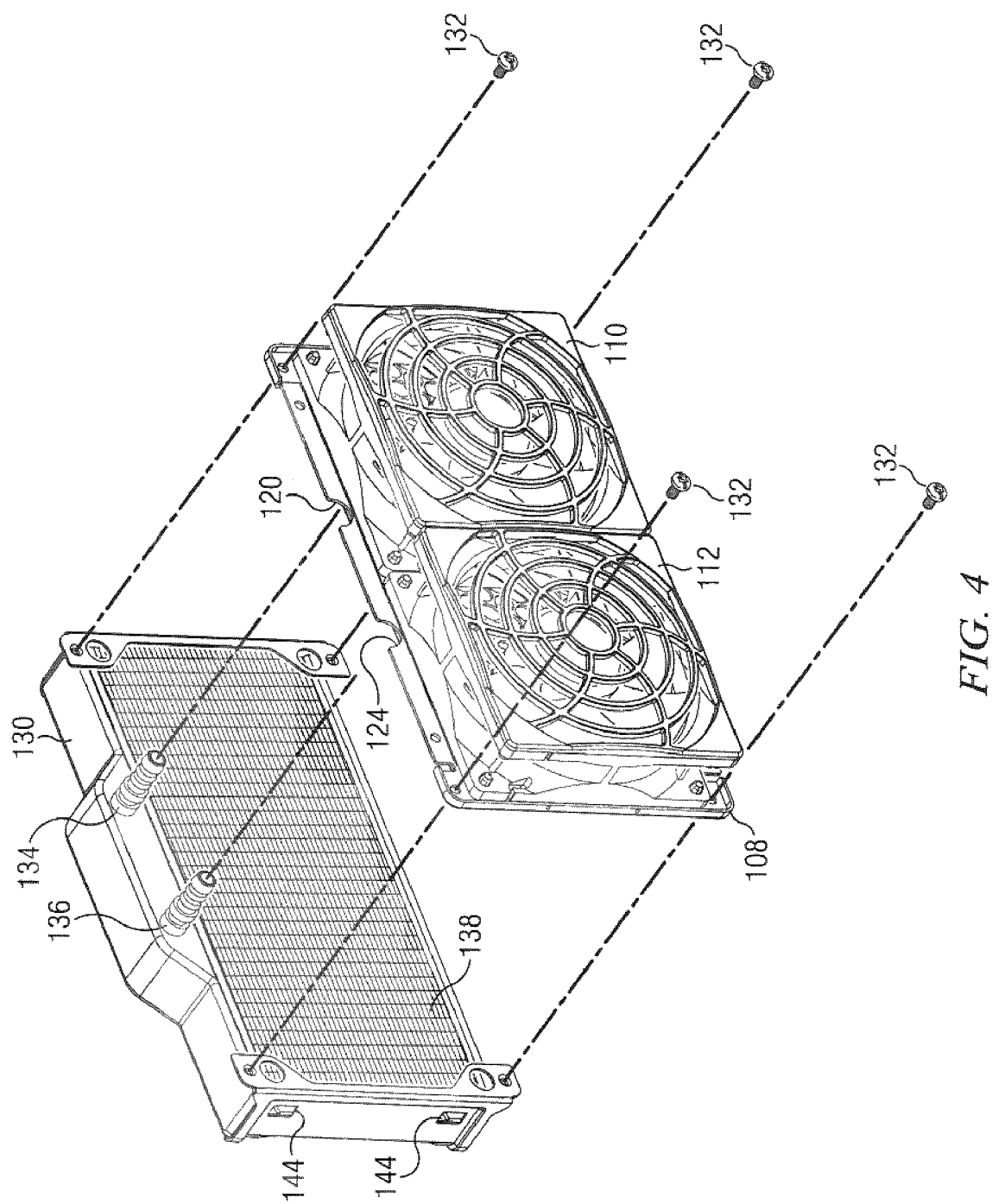
FIG. 4 is an exploded view illustrating a heat exchanger adapted to mount to the fan assembly of FIG. 1 according to a preferred embodiment of the invention.

FIGS. 1-3 illustrate a system 100 that may be easily deployed either with or without a liquid cooling system. Moreover, when system 100 is deployed with a liquid cooling system, system 100 allows the cooling system to be completely assembled and charged with coolant prior to installation within the chassis.

Chassis 102 is configured to house electronic components such as components 104, 106 within its interior volume. Chassis 102 may be any type of chassis or enclosure for housing electronic components. For example, chassis 102 may be a chassis for a desktop computer or other kind of computing device. In a preferred embodiment, chassis 102 is constructed with an electrically conductive material, such as steel, to help contain electromagnetic radiation emanating from the electronic components inside.

Grill 108 is capable of passing air through numerous holes or openings formed within it. Grill 108 also serves as a structural mounting plate for one or more fans 110, 112. Fans 110, 112 may be fastened to grill 108 in a side-by-side relationship using any conventional technique such as screws or rivets. Equivalently, grill 108 may be integrally formed with fans 110, 112. Like chassis 102, in a preferred embodiment grill 108 is formed using an electrically conductive material such as steel to help contain electromagnetic radiation within chassis 102.

Chassis 102 has an air flow opening 114 in one of its surfaces. Preferably, air flow opening 114 is defined by a continuous perimeter of the chassis material so that the structural integrity of the chassis is not broken or compromised by the opening. Air flow opening 114 should be large enough to receive the one or more fans 110, 112 that are fastened to grill 108. Preferably, air flow opening 114 should also be sufficiently large that either heat exchanger 130, grill 108 and fans 110, 112 may be passed through it, or cold plate assemblies 146, 148 may be passed through it.

Grill 108 is configured to be fastened to chassis 102 at air flow opening 114. Any conventional fastening technique may be used for this purpose, such as screws 116 as indicated in FIG. 1. Once attached to chassis 102, grill 108 substantially covers air flow opening 114 as shown in FIG. 2, and fans 110, 112 are disposed at least partially in the interior volume of chassis 102 as shown in FIG. 3.

Figure 7:
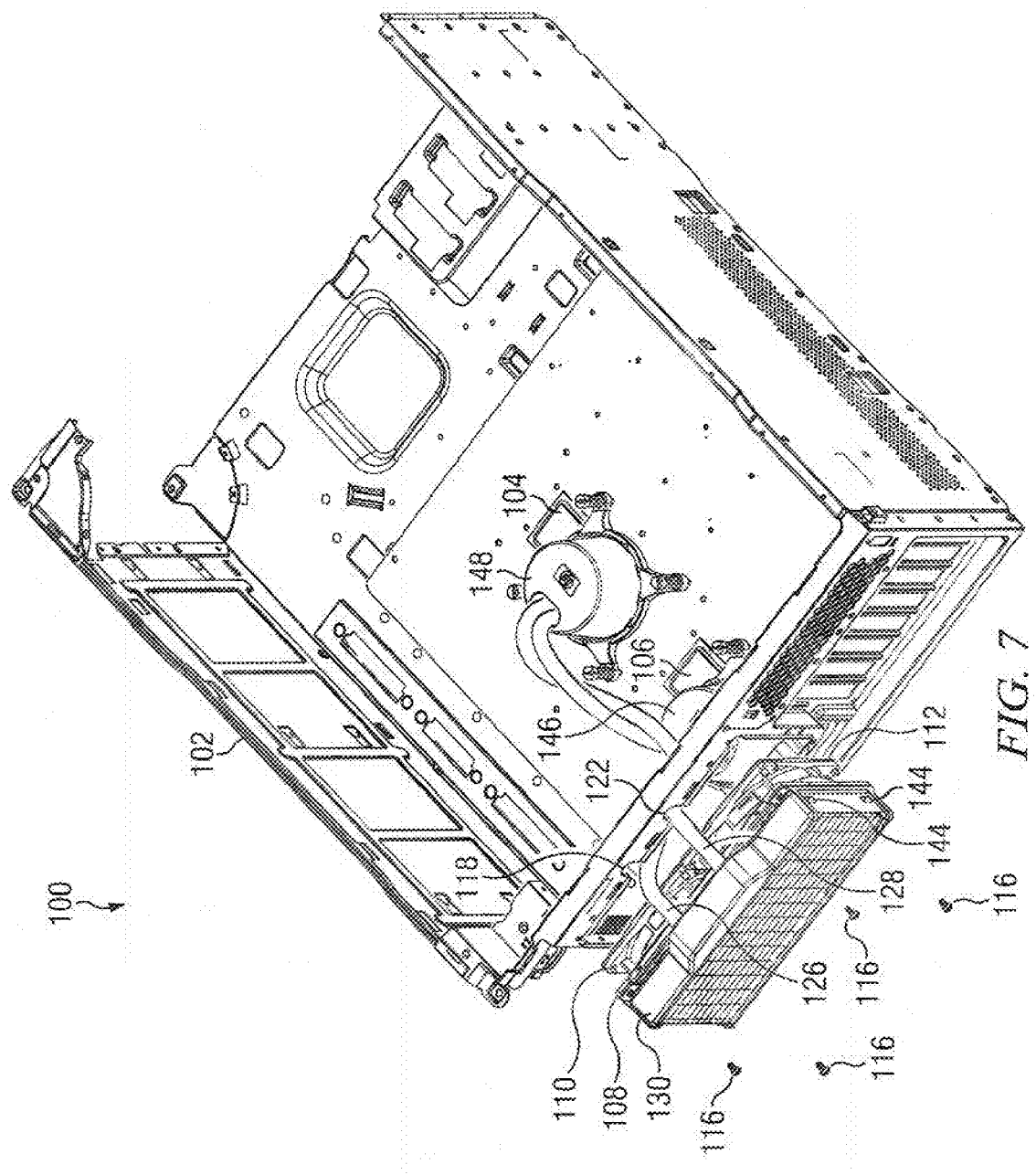
FIGS. 7 and 8 are exploded and assembled views, respectively, illustrating the mounting of the heat exchanger and fan assembly of the liquid cooling system of FIG. 5 to the chassis of FIG. 1 according to a preferred embodiment of the invention.
Figure 8:
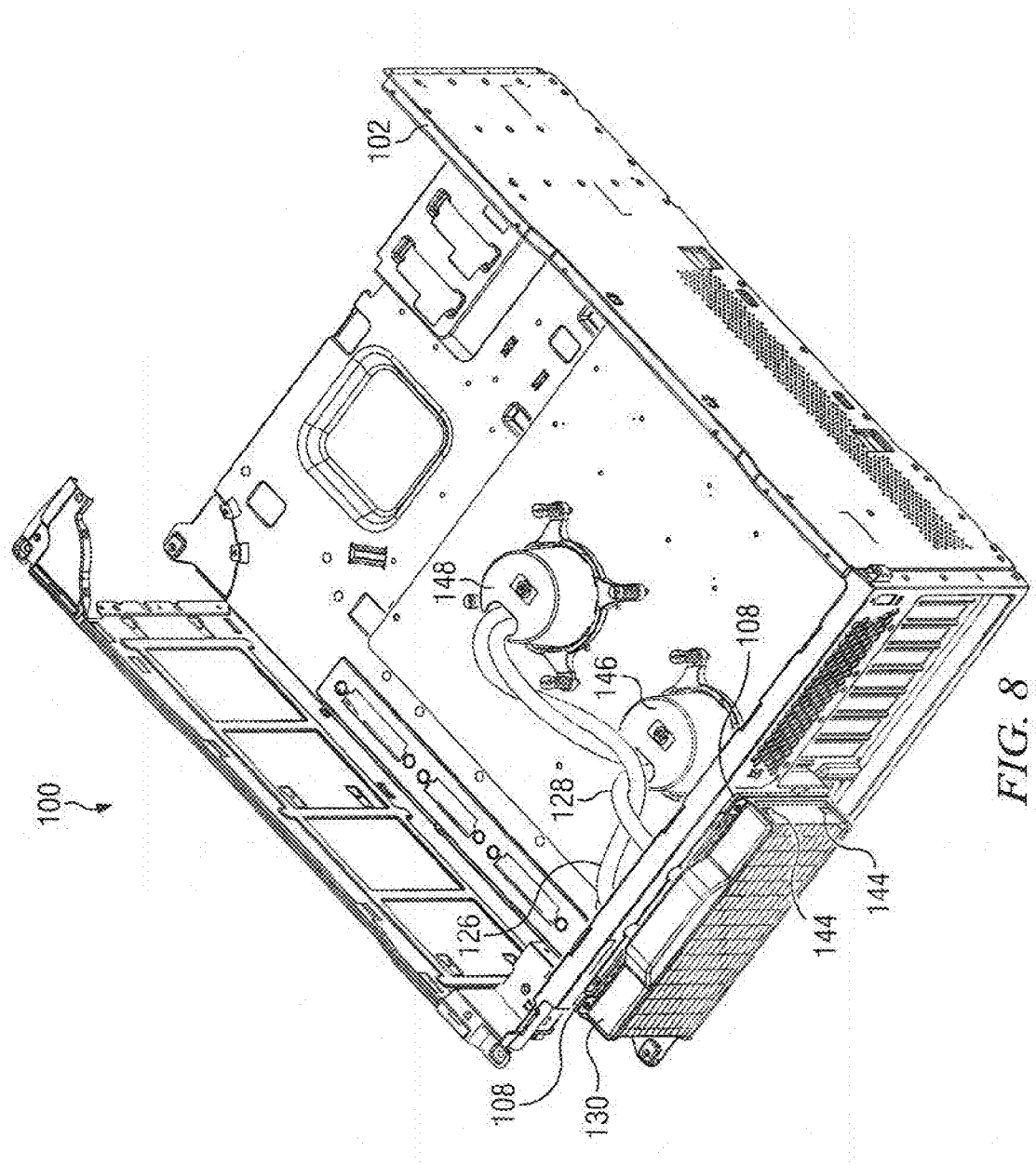
Figure 9:
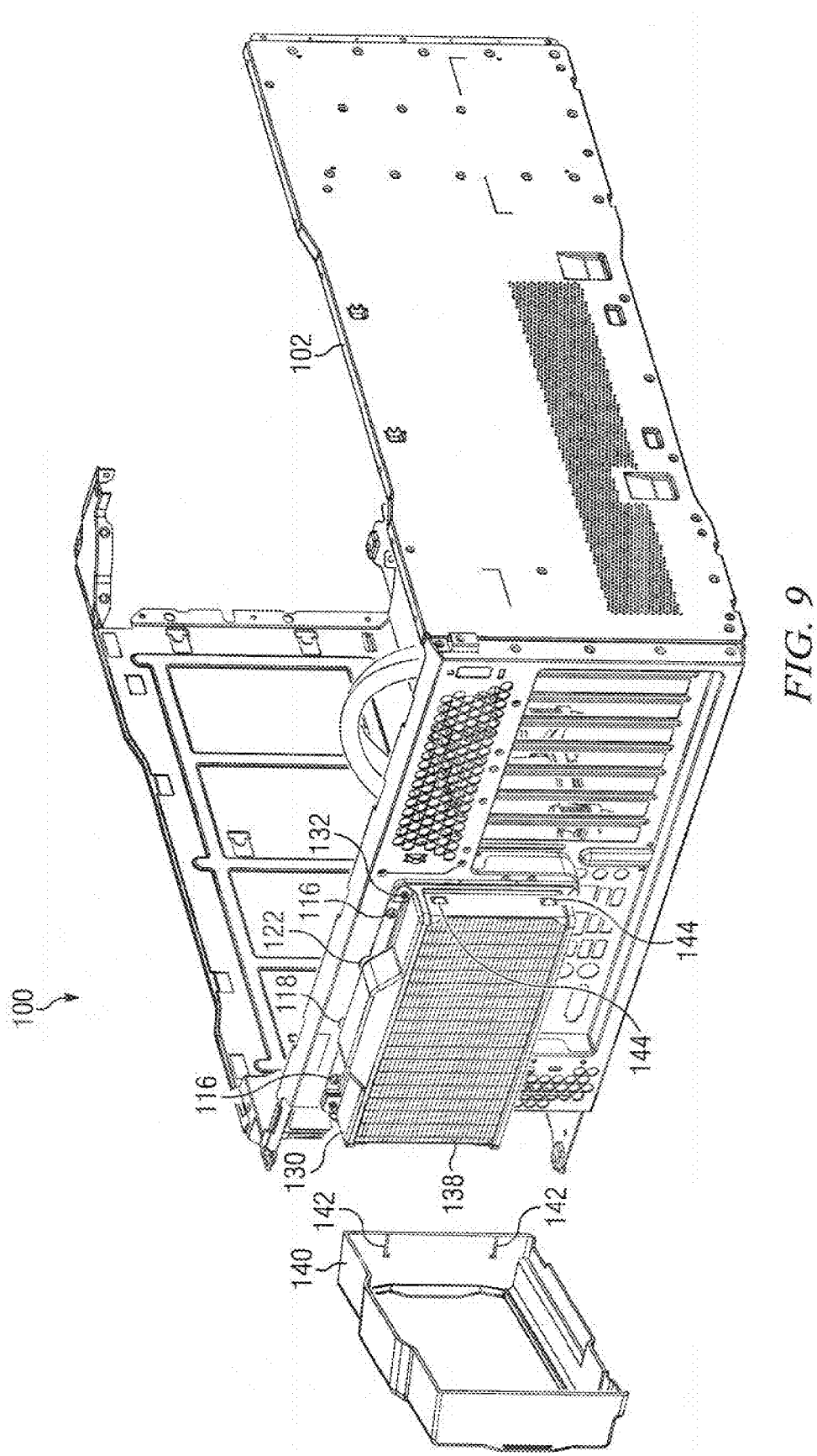
FIGS. 9 and 10 are exploded and assembled views, respectively, illustrating the mounting of a bezel onto the heat exchanger of FIG. 5 according to a preferred embodiment of the invention.
Figure 10:
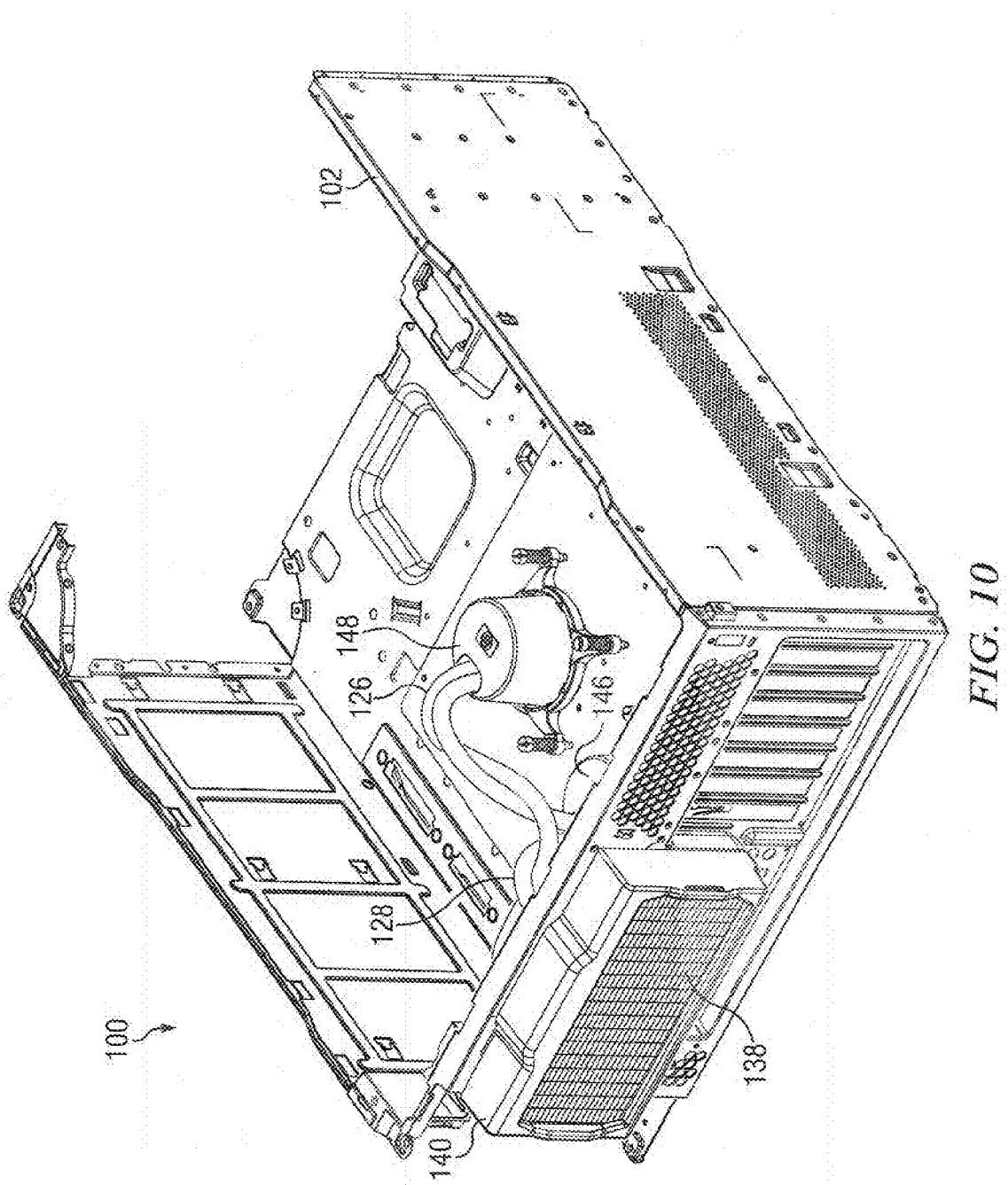

At least one recess 118/120, 122/124 is formed either in chassis 102 or in grill 108 or both. Recesses 118/120, 122/124 are sized such that a coolant conduit 126, 128 of a liquid cooling system may be inserted into the recess when grill 108 is not fastened to chassis 102 (see FIG. 7), and such that the conduit is confined within the recess when grill 108 is fastened to chassis 102 (see FIG. 8). In some embodiments, the recess may be formed entirely in chassis 102. In other embodiments, the recess may be formed entirely in grill 108. In the illustrated embodiment, the recess is formed partially in chassis 102 and partially in grill 108 so that when grill 108 is fastened to chassis 102, the complementary recesses form a circular hole in which the coolant conduit is retained. Moreover, this arrangement minimizes the size of the opening needed to receive and confine the coolant conduit, thus helping to minimize radiation of electromagnetic energy through the opening.

Referring now to FIGS. 4-10, a heat exchanger 130 for a liquid cooling system may be configured to fasten to grill 108 on the side of grill 108 opposite fans 110, 112. Heat exchanger 130 may be attached to grill 108 using any conventional fasteners such as screws 132. In the illustrated embodiment, heat exchanger 130 has a coolant inlet 134 and a coolant outlet 136, which are configured to be coupled to inlet and outlet coolant conduits 126, 128, respectively. When heat exchanger 130 is fastened to grill 108 and grill 108 is fastened to chassis 102, coolant inlet 134 is directly in line with recesses 118/120 and coolant outlet 136 is directly in line with recesses 122/124. Heat exchanger 130 substantially covers grill 108 in this configuration, thus maximizing and optimizing air flow through the central portion 138 of heat exchanger 130, where the heat transfer elements (radiating fins, for example) are located.

In the embodiment shown, air flow opening 114 is generally rectangular and both of recesses 118, 122 are located along the same side of opening 114. Correspondingly, grill 108 is generally rectangular and both of recesses 120, 124 are located along the same side of grill 108. With this configuration, both of coolant conduits 126, 128 are confined at the same side of opening 114, which helps to conserve volume within chassis 102 that may be used to place other components, and which also helps with cable management of conduits 126, 128.

In further embodiments (see FIGS. 9 and 10), a bezel 140 may be provided, configured to be fastened to heat exchanger 130. Preferably, bezel 140 covers a perimeter of heat exchanger 130 as shown, but allows air flow through the central portion 138 of heat exchanger 130 where the heat transfer elements are located. In this configuration, bezel 140 provides a cosmetic finish and enhances the efficiency of heat exchanger 130 by helping to guide air flow through its heat transfer elements, minimizing the amount of air that escapes around the perimeter of the heat exchanger.

Bezel 140 may be tool-lessly attached to heat exchanger 130 by snapping ridges 142 over raised protrusions 144. In the embodiment shown, ridges 142 are formed within bezel 140 and protrusions 144 are formed on the perimeter of heat exchanger 130. In other embodiments, the ridges may be formed on the heat exchanger and the protrusions on the bezel, or various combinations thereof. Preferably, bezel 140 is formed using a reasonably flexible material such as plastic so that ridges 142 may slip over protrusions 144 in response to a manually applied force. Note that, in the embodiment illustrated, there are a total of four ridges 142 and four protrusions 144. (Two ridges and two protrusions are present on each end of the respective parts.)

Figure 5:
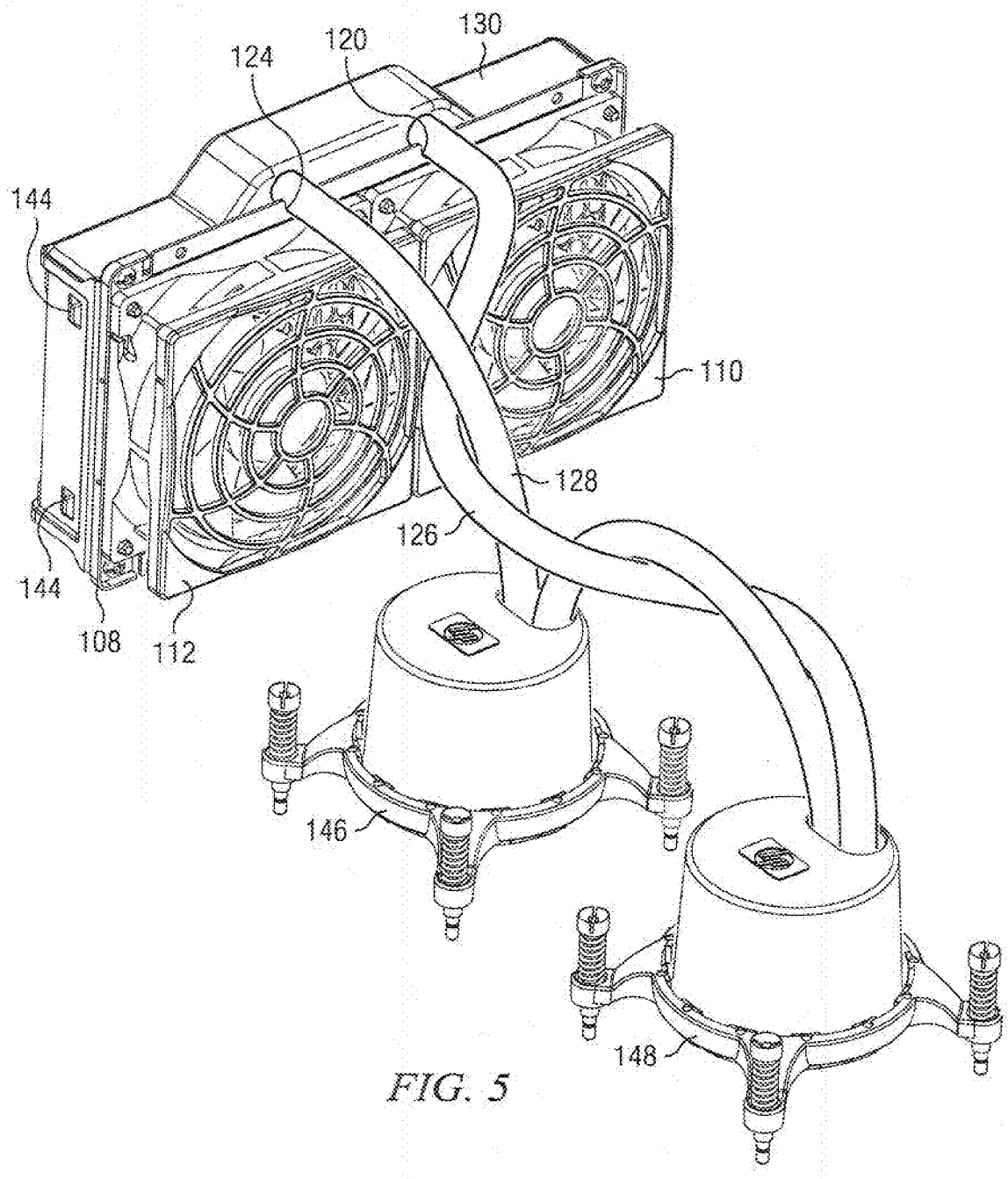
FIG. 5 illustrates an assembled closed-loop liquid cooling system utilizing the heat exchanger and fan assembly of FIG. 4 according to a preferred embodiment of the invention.
Figure 11:
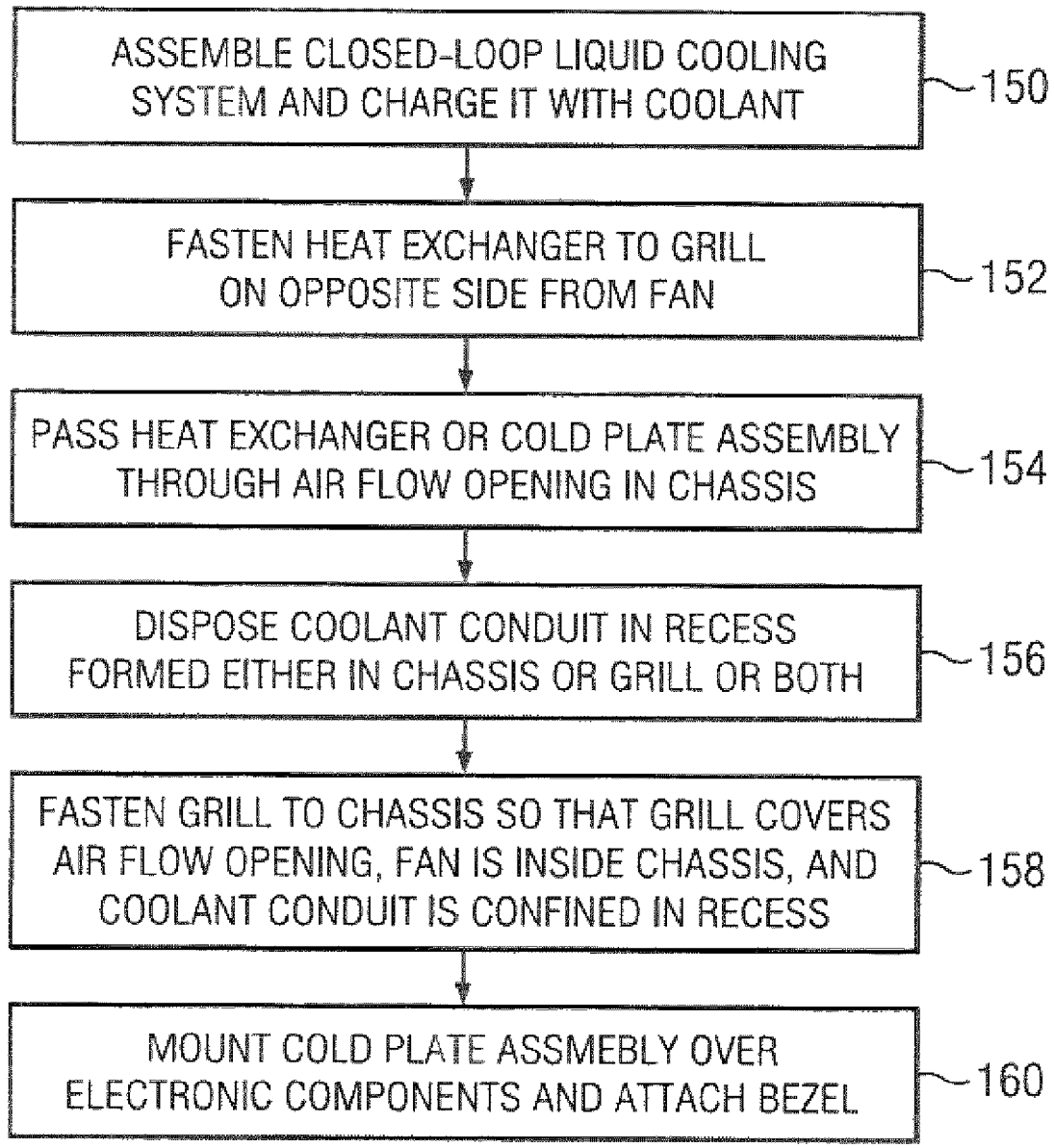
FIG. 11 is a flow diagram illustrating a preferred method for using the system of FIG. 1 to install an assembled and charged closed-loop liquid cooling system in a chassis.

FIG. 11 is a flow diagram illustrating a preferred method for using system 100. In step 150, a closed-loop liquid cooling system such as the one shown in FIG. 5 is assembled and charged with coolant. This step may be performed in a location that is sufficiently far away from chassis 102 and the electronic components therein so that the risk of leaking coolant onto the electronic components is eliminated. The closed-loop liquid cooling system need not be identical to the one illustrated. A variety of closed-loop liquid cooling systems are available from vendors. Typically, such systems include at least one cold plate assembly 146, 148 along the coolant circuit formed by the coolant conduits and the heat exchanger. In the embodiment shown, cold plate assemblies 146, 148 include coolant reservoirs.

In step 152, heat exchanger 130 is fastened to grill 108 on the side opposite fans 110, 112.

Figure 6:
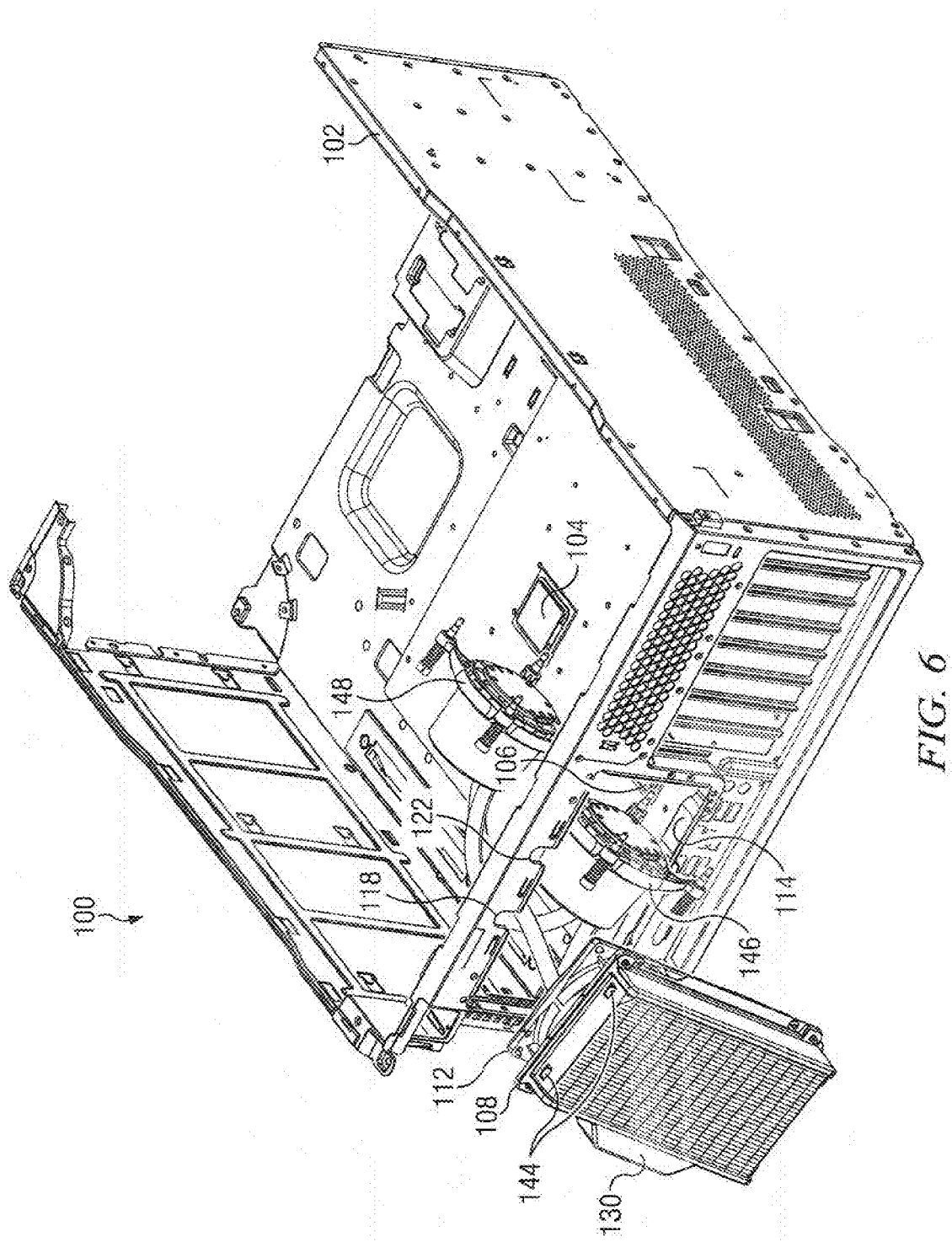
FIG. 6 illustrates the assembled liquid cooling system of FIG. 5 being passed through an air flow opening in the chassis of FIG. 1 according to a preferred embodiment of the invention.

In step 154, either heat exchanger 130 or cold plate assemblies 146, 148 are passed through air flow opening 114, as shown in FIG. 6.

In step 156, coolant conduits 126, 128 are disposed at least partially within recesses 118/120 and 122/124.

In step 158, grill 108 is fastened to chassis 102 such that fans 110, 112 are disposed at least partially inside chassis 102, such that grill 108 substantially covers opening 114, and such that conduits 126, 128 are confined within recesses 118/120 and 122/124.

In step 160, cold plate assemblies 146, 148 are mounted over electronic components 106, 104. And if desired, bezel 140 may be attached to heat exchanger 130.

The entire process just described in steps 152-160 may be performed without disassembling any portion of the coolant circuit of the closed-loop liquid cooling system.

The inventive system achieves numerous benefits that prior art systems have failed to achieve. For example, the inventive system allows the largest component of the liquid cooling apparatus—the heat exchanger—to be mounted external to the enclosure without disconnecting the closed-loop coolant circuit of the cooling apparatus during installation. The inventive system also allows for reuse of existing fans when retrofitting an enclosure to use liquid cooling. The inventive system frees space within the enclosure, allowing easier access therein to replaceable components. And the inventive arrangement allows for more efficient overall system cooling because the fans that force air over the liquid cooling heat exchanger also force air through the entire enclosure, helping to cool all of the components therein.

While the invention has been described in detail with reference to preferred embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

What is claimed is:

1. A system for attaching a liquid cooling apparatus to a chassis, comprising:

the liquid cooling apparatus including at least one fan, a heat exchanger, at least one cold plate, a grill, and at least one coolant conduit coupled to the heat exchanger and the at least one cold plate, the heat exchanger, the at least one cold plate, the grill, and the at least one coolant conduit being assembled together, the grill is fastened to the at least one fan;

wherein the chassis houses electronic components in an interior volume of the chassis and has an air flow opening large enough to receive the at least one fan;

the grill to be fastened to the chassis such that, when the grill is so fastened to the chassis, the at least one fan is disposed at least partially in the interior volume of the chassis and the grill covers at least a portion of the air flow opening; and at least one recess formed in the grill such that the at least one coolant conduit is able to be inserted into the at least one recess when the grill is not fastened to the chassis and the at least one coolant conduit is confined within the at least one recess when the grill is fastened to the chassis.

2. The system of claim 1, wherein:

the at least one fan comprises first and second fans in a side-by-side relationship.

3. The system of claim 1, wherein:

the grill and the chassis are both electrically conductive.

4. The system of claim 1, wherein: the air flow opening is defined by a continuous perimeter of chassis material of the chassis.

5. The system of claim 1, wherein: the air flow opening is sufficiently large that either the heat exchanger or the at least one cold plate assembly is able to be passed through the air flow opening.

6. The system of claim 1, further comprising: the heat exchanger is fastened to the grill on a side of the grill opposite the at least one fan.

7. The system of claim 6, wherein: the at least one recess comprises a first recess and a second recess; the heat exchanger has a coolant inlet and a coolant outlet coupled to an inlet coolant conduit and an outlet coolant conduit of the at least one cooling conduit, respectively; the first recess is sized to receive the inlet coolant conduit; and the second recess is sized to receive the outlet coolant conduit.

8. The system of claim 7, wherein:
when the heat exchanger is fastened to the grill and the grill is fastened to the chassis, the coolant inlet is directly in line with the first recess and the coolant outlet is directly in line with the second recess.

9. The system of claim 7, wherein: the grill is rectangular, and at least a portion of each of the first recess and the second recess is located along one side of the grill.

10. The system of claim 7, wherein: the air flow opening is rectangular, and at least a portion of each of the first recess and the second recess is located along one side of the air flow opening.

11. The system of claim 6, wherein:
when the heat exchanger is fastened to the grill, the heat exchanger covers at least a portion of the grill.

12. The system of claim 6, further comprising: a bezel to be fastened to the heat exchanger such that the bezel covers at least a portion of a perimeter of the heat exchanger but allows air flow through a central portion of the heat exchanger.

13. The system of claim 12, wherein: the bezel is to be fastened to the heat exchanger by snapping ridges over raised protrusions, the snapping ridges formed on one of the heat exchanger or the bezel and the raised protrusions formed on another of the heat exchanger or the bezel.

14. The system of claim 1, wherein:
the at least one recess is formed both in the chassis and in the grill.

15. A method of installing an assembled and charged closed-loop liquid cooling system in a chassis that is configured to house electronic components, wherein the assembled and charged closed-loop liquid cooling system including at least one fan, a heat exchanger, at least one cold plate, a grill, and at least one coolant conduit coupled to the heat exchanger and the at least one cold plate, said method comprising:
fastening the heat exchanger on a first side of the grill to which the at least one fan is fastened on a second side of the grill opposite the first side;
passing either the heat exchanger or the at least one cold plate through an air flow opening formed in the chassis;
disposing at least one coolant conduit at least partially within a recess formed in at least one of the chassis or the grill; and fastening the grill to the chassis such that it substantially the grill covers at least a portion of the air flow opening, such that the at least one fan is disposed at least partially inside the chassis, and such that the at least one coolant conduit is confined within the recess.

16. The method of claim 15, wherein: the entire process is performed without disassembling any portion of the assembled and charged closed-loop liquid cooling system.

17. The method of claim 15, wherein:
at least a portion of the recess is located along a perimeter of the air flow opening.

18. The method of claim 15, further comprising: attaching a bezel to the heat exchanger such that the bezel covers at least a portion of a perimeter of the heat exchanger but allows air to flow across heat transfer elements of the heat exchanger.

19. The method of claim 18, wherein: attaching the bezel comprises snapping ridges over protrusions, the snapping ridges formed on one of the heat exchanger or the bezel and the protrusions formed on another of the heat exchanger or the bezel.

20. A system, comprising:
a chassis to house electronic components;
an assembled liquid cooling system including at least one fan, a heat exchanger, at least one cold plate, at least one coolant conduit coupled to the heat exchanger, the at least one cold plate and a means for mounting the heat exchanger and the at least one fan to the chassis such that at least a portion of the at least one fan is disposed inside the chassis and at least a portion of the heat exchanger is disposed outside the chassis, wherein the heat exchanger is fastened to one side of the means for mounting and the at least one fan is fastened to an opposite side of the means for mounting;
a means for allowing air to flow through the chassis, the at least one fan and the heat exchanger; and
a means for receiving and confining at least one coolant conduit when the means for mounting is fastened to the chassis.

* * * * *